(12) United States Patent
Ono et al.

(10) Patent No.: US 7,364,972 B2
(45) Date of Patent: Apr. 29, 2008

(54) SEMICONDUCTOR DEVICE

(75) Inventors: Mizuki Ono, Yokohama (JP); Akira Nishiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/560,061

(22) Filed: Nov. 15, 2006

(65) Prior Publication Data
US 2007/0072478 A1    Mar. 29, 2007

Related U.S. Application Data

(62) Division of application No. 10/951,651, filed on Sep. 29, 2004, now abandoned, which is a division of application No. 10/631,792, filed on Aug. 1, 2003, now Pat. No. 6,847,084.

(30) Foreign Application Priority Data
Sep. 5, 2002    (JP)    .............................. 2002-259598

(51) Int. Cl.
*H01L 21/8234* (2006.01)

(52) U.S. Cl. ...................... 438/275; 438/197; 438/195; 438/199; 438/216; 438/228; 438/232; 438/243; 257/E21.632

(58) Field of Classification Search ................ 438/195, 438/216, 275, 228, 232
See application file for complete search history.

(56) References Cited

U.S. PATENT DOCUMENTS 5,818,099 A    10/1998  Burghartz
5,885,874 A *   3/1999  Gardner ....................... 438/289
6,027,961 A *   2/2000  Maiti et al. .................. 438/199
6,828,185 B2   12/2004  Lim et al.
2002/0000593 A1  1/2002  Nishiyama et al.
2002/0006054 A1*  1/2002  Shukuri et al. .............. 365/145

FOREIGN PATENT DOCUMENTS

JP    2002-16063    1/2002
JP    2000-307010   11/2002

OTHER PUBLICATIONS

G. Lucovsky, et al., "Microscopic Model for Enhanced Dielectric Constants in Low Concentration $SiO_2$-Rich Noncrystalline Zr and Hf Silicate Alloys," Applied Physics Letters, vol. 77, No. 18, Oct. 30, 2000, pp. 2912-2914.
Angus I. Kingon, et al., "Alternative Dielectrics to Silicon Dioxide for Memory and Logic Devices," Nature, vol. 406, Aug. 13, 2000, pp. 1032-1038.

* cited by examiner

*Primary Examiner*—Michael S. Lebentritt
*Assistant Examiner*—Kyoung Lee
(74) *Attorney, Agent, or Firm*—Oblon, Spivak, McClelland, Maier & Neustadt, P.C.

(57) ABSTRACT

A semiconductor device comprises a semiconductor substrate, a first circuit formed on the substrate, and a second circuit connected to the first circuit as an input/output portion thereof and powered by a voltage higher than that for the first circuit, the first circuit including a first and a second field-effect transistor, the first drain region of the first transistor accompanying a first load capacitance, the second drain region of the second transistor accompanying a second load capacitance smaller than the first load capacitance, and the first gate insulation film of the first transistor having an average relative dielectric constant higher than that of the second gate insulation film of the second transistor, thereby realizing a high operation speed.

3 Claims, 10 Drawing Sheets

SEMICONDUCTOR DEVICE

CROSS-REFERENCE TO RELATED APPLICATIONS

This application is based upon and claims the benefit of priority from the prior Japanese Patent Application No. 2002-259598, filed Sep. 5, 2002, the entire contents of which are incorporated herein by reference.

BACKGROUND OF THE INVENTION

1. Field of the Invention

The present invention relates to a semiconductor device.

2. Description of the Related Art

For a field-effect transistor for use in a related-art large scale integrated circuit (LSI) apparatus, miniaturization of elements has been advanced in order to increase the operation speed and to reduce power consumption. As a method of miniaturizing an element, especially the effective thickness of the gate insulation film has been reduced.

However, with the reduction of the thickness of the silicon oxide film which has heretofore been used in the gate insulation film, a problem occurs that a tunnel current flows through the film. To solve the problem, a metal silicate material, which is high in relative dielectric constant compared with silicon oxide, has been used in the gate insulation film. For the gate insulation film formed of the metal silicate material, even with about 1 nm in terms of an equivalent silicon oxide film thickness, the actual physical film thickness can be sufficiently large to prevent the tunnel current.

Moreover, to increase the sophistication of the integrated circuit while keeping the power supply voltage constant, there is a method of driving transistors constituting an input/output circuit at a high voltage; and driving transistors constituting an inner circuit other than an input/output portion at a low voltage. Therefore, an LSI apparatus has been proposed in which the transistors constituting the input/output circuit each includes a gate insulation film formed of a silicon oxide based material and in which the transistors constituting the inner circuit each includes a gate insulation film containing a dielectric material higher in dielectric constant than the silicon oxide based material (e.g., see Jpn. Pat. Appln. KOKAI Publication No. 2000-307010).

As described above, in the LSI apparatus, field-effect transistors connected to various load capacitances are integrated. However, in the related-art LSI apparatus, in the internal circuit which actually performs a calculation process, for both the field-effect transistors connected to a relatively large load capacitance and a relatively small load capacitance, the gate insulation film is formed of the same material. Therefore, performance of the whole LSI apparatus cannot be enhanced.

Under these circumstances, there has been a demand for realization of a semiconductor device in which a plurality of transistors having appropriate driving forces in accordance with a size of the load capacitance can be integrated as the internal circuit on one semiconductor substrate.

BRIEF SUMMARY OF THE INVENTION

According to one aspect of the present invention, there is provided a semiconductor device comprising:
a semiconductor substrate;
a first circuit formed on the semiconductor substrate, the first circuit including first and second field-effect transistors,
the first field-effect transistor comprising:
a first source region and a first drain region formed apart from each other on a surface of the semiconductor substrate;
a first gate insulation film formed between the first source region and the first drain region; and
a first gate electrode formed on the first gate insulation film,
the second field-effect transistor comprising:
a second source region and a second drain region formed apart from each other and apart from the first field-effect transistor on the surface of the semiconductor substrate;
a second gate insulation film formed between the second source region and the second drain region; and
a second gate electrode formed on the second gate insulation film,
the first drain region of the first field-effect transistor accompanying a first load capacitance, the second drain region of the second field-effect transistor accompanying a second load capacitance which is smaller than the first load capacitance, and the first gate insulation film of the first field-effect transistor having an average relative dielectric constant higher than that of the second gate insulation film of the second field-effect transistor, and
a second circuit coupled to the first circuit as an input/output portion of the first circuit and powered by a voltage higher than that for the first circuit.

DETAILED DESCRIPTION OF THE INVENTION

Prior to concrete description of embodiments, the technical background of the present invention will be described.

The present inventors have studied metal silicate materials which are gate insulation film materials of a field-effect transistor. For the metal silicate material, a heat step of improving film quality after forming a film on a semiconductor substrate is required. However, the metal in the gate insulation film has a property of being crystallized and precipitated in the form of metal oxide in accordance with the temperature or time of the heat step and metal concentration in the metal silicate film.

Therefore, with the use of the metal silicate material in the gate insulation film material, after the heat step, crystal grains of metal oxide are precipitated in the gate insulation film variously with each element. Accordingly, crystalline and amorphous materials exist in the gate insulation film, and component elements of the gate insulation film become nonuniform. As a result, the relative dielectric constant of the gate insulation film becomes nonuniform with each element. Here, as an index to quantify the nonuniformity, a standard deviation of volumes of the metal oxide crystal grains in the gate insulation film can be used to quantify the nonuniformity.

The present inventors have used a metal silicate film in which metal oxide is precipitated as an example to model the average relative dielectric constant of the gate insulation film having nonuniformity in the relative dielectric constant, and have obtained the following new findings. The "average relative dielectric constant" referred to herein is a relative dielectric constant obtained by considering the electrostatic capacitance per unit area obtained when flat electrodes are disposed on opposite sufficiently broad surfaces of a film as the electrostatic capacitance of a parallel flat plate capacitor constituted by a uniform dielectric material.

Figure 1:
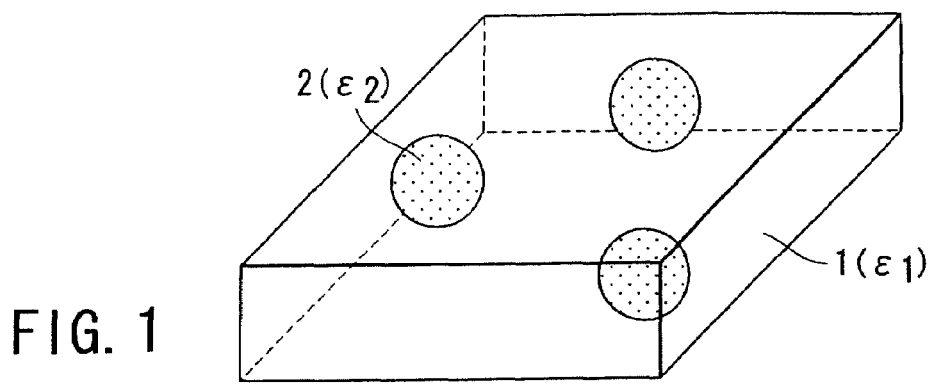
FIG. 1 is a perspective view schematically showing the state of an insulation film in which particles each having a relative dielectric constant $\epsilon_2$ in a rectangular parallelepiped having a relative dielectric constant $\epsilon_1$.

As shown in FIG. 1, a rectangular parallelepiped 1 in which particles 2 each having a relative dielectric constant $\epsilon_2$ are embedded and which has a relative dielectric constant $\epsilon_1$ is formed into a model of the metal silicate film in which metal oxide is precipitated.

Under this modeling, the average relative dielectric constant ($\epsilon_{av}$) of the film can be represented by the following equation, in which a field produced by electric charges induced onto a depolarization field, Lorentz field, and electrode is considered. This has been newly discovered by this study.

$$\epsilon_{av} = \epsilon_1 \left[ 1 + \frac{\frac{4(\epsilon_2 - \epsilon_1)}{2\epsilon_1 + \epsilon_2} \pi \left(\frac{R}{T}\right)^3 (nT^2)}{1 - \frac{4(\epsilon_2 - \epsilon_1)}{2\epsilon_1 + \epsilon_2} \zeta(3) \left(\frac{R}{T}\right)^3} \right] \quad (1)$$

wherein T denotes the thickness of an insulation film, R denotes the radius of the particle having the relative dielectric constant $\epsilon_2$, n denotes the number of particles each having the relative dielectric constant $\epsilon_2$ per unit area, considered in an in-plane direction of the insulation film, and $\zeta(3)$ denotes the total sum of a cubic inverse number of a natural number. It is to be noted that in the calculation result described herein, the center of the particle having the relative dielectric constant $\epsilon_2$ is assumed to be in the middle of the thickness direction of the insulation film. However, since dependence of the average relative dielectric constant on a position of the particle is weak, the center of the particle does not necessarily agree with the middle of the thickness direction of the insulation film. Even in this case, a similar result is obtained.

Figure 2:
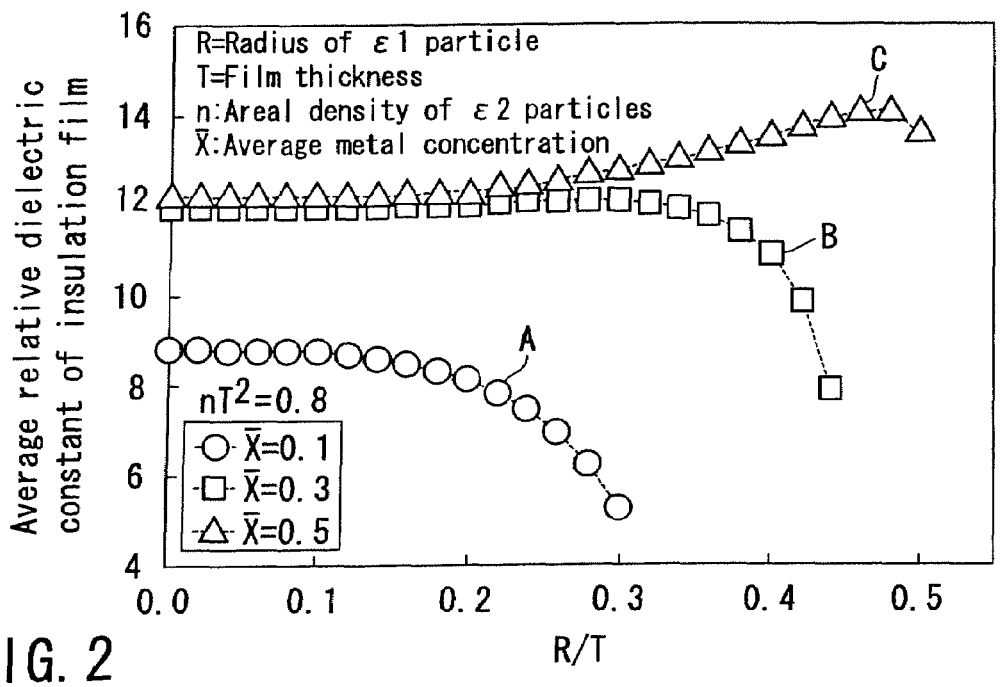
FIG. 2 is a graph showing the relation between an average relative dielectric constant of the insulation film and R (radius of the particle)/T (film thickness)

FIG. 2 shows the dependence of the average relative dielectric constant on R/T with $nT^2=0.8$ as an example of the newly obtained finding.

In this graph, the average value ($\overline{X}$) of metal concentration in the film is used as a parameter, and is varied into three values of 0.1, 0.3, and 0.5. A region having the relative dielectric constant $\epsilon_2$ is assumed to be precipitated metal oxide, and $\epsilon_2=20$ is assumed. For the region of $\epsilon_1$, the metal silicate material whose metal concentration decreases below the average value in the film with the precipitation of metal oxide is assumed. The dielectric constant is calculated using the following equation (2). It is to be noted that this equation is detailed in G. Lucovsky et al., App. Phys. Lett. Vo. 77 no. 18 (2000) pp. 2912 to 2914.

Relative dielectric constant of metal silicate material=

$$12 - 8.1 \times (1 - 2 \times X)^4 \quad (2)$$

Figure 3:
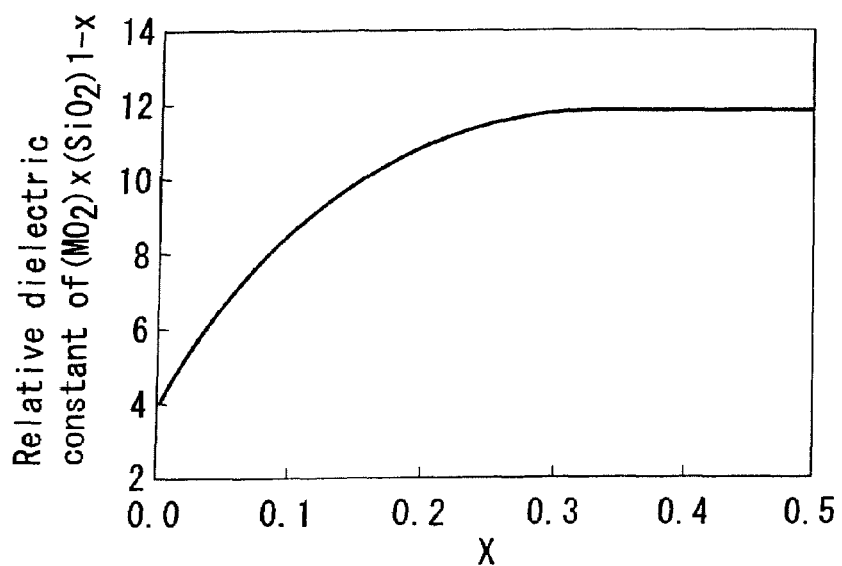
FIG. 3 is a diagram showing the relation between the relative dielectric constant and a metal composition ratio X of $(MO_2)_x(SiO_2)_{1-x}$.

Here, the metal silicate material is $(MO_2)_x(SiO_2)_{1-x}$ (M represents the metal, Hf or Zr in this case). As apparent from the above equation, X denotes the composition ratio of metal oxide, but X is also equal to (the number of atoms of M)/(the number of atoms of M+the number of atoms of Si). Therefore, in this case, X can also refer to the metal concentration. This equation is shown in a graph of FIG. 3. As seen in FIG. 3, when the composition ratio X of metal oxide increases, the relative dielectric constant of the metal silicate material rises.

Moreover, different from tendency shown in FIG. 3, as shown in a curve A of FIG. 2, when the average value of the metal concentration of the gate insulation film is low, for example, when the average value of the metal concentration in the gate insulation film is 0.1, the average relative dielectric constant decreases with the precipitation of metal oxide (with an increase of R/T). Especially, the decrease in the relative dielectric constant is remarkable if R/T exceeds 0.1.

As shown by a curve B in FIG. 2, when the average value of the metal concentration of the gate insulation film is higher than 0.1, for example, when the average value of the metal concentration in the gate insulation film is 0.3, the average relative dielectric constant slightly increases with the precipitation of metal oxide and then decreases.

Moreover, as shown by a curve C in FIG. 2, when the average value of the metal concentration in the gate insulation film is higher than 0.3, for example, when the average value of the metal concentration in the gate insulation film is 0.5, the average relative dielectric constant further increases with the precipitation of metal oxide. This new finding has been obtained.

It is to be noted that when calculation is performed based on the equation (1), a new finding is obtained. That is, with the precipitation of metal oxide, the average relative dielectric constant increases when the average value of the metal concentration is higher than about 25% as a boundary. When the average value is lower than the boundary, the average relative dielectric constant decreases. Moreover, the increase of the average relative dielectric constant accompanied with the precipitation of metal oxide is remarkable when the average value of the metal concentration is about 40% or more. The increase is further remarkable with an average value of 50% or more. This new finding has also been obtained.

Additionally, in an internal circuit of an integrated circuit, a field-effect transistor has a function of driving another field-effect transistor, and also works as a load capacitance of another field-effect transistor. Considering from a viewpoint of the load of another field-effect transistor, an electrostatic capacitance which is the load capacitance of the field-effect transistor is preferably smaller.

Therefore, considering that the field-effect transistor is the load capacitance, when the average value of the metal concentration in the metal silicate film is low as 0.1, and when metal oxide is precipitated, the electrostatic capacitance preferably becomes low. Conversely, when the average value of the metal concentration in the metal silicate film is higher than 0.3, and when metal oxide is not precipitated, the electrostatic capacitance is preferably prevented from rising. This new finding has also been obtained.

On the other hand, considering of the function of the field-effect transistor to drive another field-effect transistor, the relative dielectric constant of the gate insulation film is preferably larger. Additionally, if the precipitation of metal oxide occurs in the gate insulation film using the metal silicate material, the dielectric constant increases only in a region where deposits are generated. Therefore, when voltage is applied to the gate electrode, a large number of carriers are induced in a channel region in the vicinity of the deposits of metal oxide. Even when a large number of carriers are induced, this is restricted in the vicinity of the deposits of metal oxide having a high dielectric constant. Therefore, these carriers cannot contribute to electric conduction.

For this reason, a current driving capability of the field-effect transistor is considered to be substantially determined by a dielectric constant of a region where the dielectric constant in the gate insulation film is low. That is, the dielectric constant of the metal silicate material whose metal concentration drops with the precipitation of metal oxide determines the current driving capability of the field-effect transistor.

As shown in FIGS. 2 and 3, considering from the dependence of the relative dielectric constant of metal silicate on the metal concentration, when the average value of the metal concentration in the gate insulation film is low as 0.1, the relative dielectric constant drops with the precipitation of metal oxide, and the current driving capability of the field-effect transistor drops.

However, when the average value of the metal concentration is higher than 0.3, the dielectric constant of the region having the relative dielectric constant $\epsilon 1$ hardly changes, even if the precipitation of metal oxides occurs. Therefore, the precipitation of metal oxides, if it occurs, hardly lowers the current driving capability. Furthermore, as shown in FIG. 4, when a path for connecting a source 3 side to a drain 4 side is formed by metal oxide 6 precipitated in a gate insulation film 5, the carriers induced in a channel region (not shown) can move, and the current driving capability of the field-effect transistor is therefore enhanced.

Figure 4:
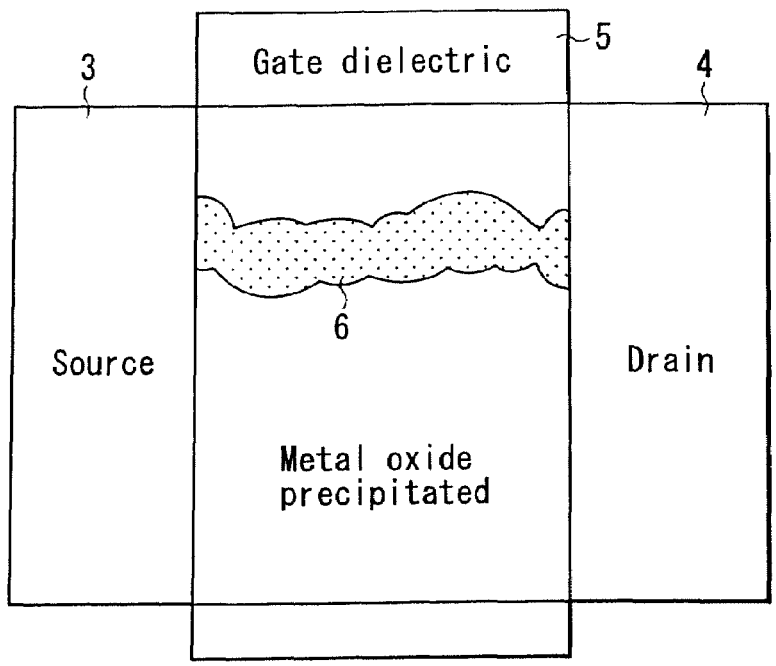
FIG. 4 is a schematic view showing metal oxide precipitated in a gate insulation film.

It is to be noted that FIG. 4 is a top plan view showing that a gate electrode (not shown) having the same shape as that of the gate insulation film is formed on a semiconductor substrate via the gate insulation film 5. The gate electrode is positioned between the source region 3 and drain region 4.

FIG. 4 shows only one path of the metal oxide, but this is a schematic view for description. It is not essential that there is only one such path. Even when a plurality of paths exist, the essence of the following description does not change at all. This also applies, even if the path includes branches or has a mesh form.

When this path can be formed, a large amount of induced carriers can contribute to the electric conduction. Moreover, as shown in FIG. 3, when the average value of the metal concentration in the metal silicate material is high, the drop of the relative dielectric constant of the metal silicate material by the drop of the metal concentration in the metal silicate material with the precipitation of metal oxide is remarkably small.

As a result, when the average value of the metal concentration in the gate insulation film formed of the metal silicate material is higher than 0.3, and when the precipitation of a large amount of metal oxide occurs, the current driving capability of the field-effect transistor rises with the precipitation of metal oxide.

As described above, considering from a viewpoint of the current driving capability of the field-effect transistor, when the average value of the metal concentration in the gate insulation film is as low as 0.1, metal oxide is not precipitated preferably. When the average value of the metal concentration in the gate insulation film is higher than 0.3, the new finding that metal oxide is preferably precipitated is obtained.

From the above-described consideration, in the field-effect transistor in which the metal silicate material is used in the gate insulation film, even when the average value of the metal concentration in the gate insulation film is high or low, there is a problem of trade-off in consideration of two viewpoints including the current driving capability and load capacitance.

This is the new finding obtained by this study with respect to the dielectric constant of the gate insulation film which has nonuniformity in the relative dielectric constant.

To solve the problem, the present inventors have considered and provided a semiconductor device in which the field-effect transistor containing the deposit of metal oxide and the field-effect transistor containing no or little amount of the deposit of metal oxide are both integrated in the gate insulation film formed of the metal silicate material.

In this case, the field-effect transistor large both in the current driving capability and capacitance and the field-effect transistor small both in the current driving capability and capacitance are integrated as the internal circuit on one semiconductor substrate. In the integrated circuit, each field-effect transistor has a function of driving another field-effect transistor, and also is the load of the other field-effect transistor.

Here, the field-effect transistor including a large load capacitance connected to the drain region is regarded as a first field-effect transistor, and the field-effect transistor including a relatively smaller load capacitance connected to the drain region is regarded as a second field-effect transistor.

Since the load capacitance connected to the drain region of the first field-effect transistor is large, much time is required for charge/discharge, and this limits an operation speed of the whole semiconductor device. Therefore, the current driving capability of the first field-effect transistor is preferably larger in order to enhance the operation speed of the whole semiconductor device. Therefore, in an element including a large load capacitance to be driven such as the first field-effect transistor, it is preferable to precipitate the metal oxide in the gate insulation film and to increase the average relative dielectric constant of the gate insulation film.

On the other hand, for the second field-effect transistor, as compared with the first field-effect transistor, since the load capacitance connected to the drain region is small, the current driving capability of the second field-effect transistor does not limit the operation speed of the whole semiconductor device. Therefore, when the current driving capability of the second field-effect transistor increases, the operation speed of the whole semiconductor device cannot be expected to be largely enhanced.

On the other hand, when the metal oxide is precipitated in the gate insulation film of the second field-effect transistor, a parasitic capacitance is increased. Therefore, a total load capacitance of the field-effect transistor including the load capacitance of the second field-effect transistor increases. Therefore, in an element including a small load capacitance to be driven such as the second field-effect transistor, the metal oxide (crystalline material) is prevented from being precipitated in the gate insulation film if possible, and the parasitic capacitance has to be reduced. Therefore, the whole gate insulation film is preferably formed of the amorphous material.

Described above is the case where, the average value of the metal concentration in the gate insulation film is higher than 0.3, and as shown in FIG. 4, the source 3 is connected to the drain 4 by the path of the region 6 having the high relative dielectric constant with the precipitation of metal oxide.

When the average value of the metal concentration in the gate insulation film is 0.1 or less, the situation differs. In this case, as aforementioned, with the precipitation of metal oxide, the current driving capability of the field-effect transistor drops. However, as shown in FIG. 2, the average relative dielectric constant of the gate insulation film also drops. Therefore, considering from the current driving capability of the field-effect transistor, the precipitation of metal oxide in the gate insulation film is not preferable. Considering from a viewpoint that the field-effect transistor makes the load capacitance connected to the other field-effect transistor, the precipitation of metal oxide is preferable.

Therefore, when the average value of the metal concentration in the gate insulation film is 0.1 or less, in the field-effect transistor having a small ratio of the capacitance occupying the total load capacitance of the other field-effect transistor including the load capacitance of the field-effect transistor, the precipitation of metal oxide in the gate insulation film is preferably inhibited.

Even when the average value of the metal concentration in the gate insulation film is 0.3 or more, the precipitation of metal oxide is inhibited, and the composition ratio ($\overline{X}$) of metal oxide is controlled to be 0.1 or less. Then, the field-effect transistor can be used as the second field-effect transistor. The above effect is also attainable by the formation that a ratio of an average radius of the metal oxide to a thickness of the insulation film is 0.1 or less.

In the semiconductor device of the present invention, metal oxide is precipitated in the field-effect transistor in which it is preferable to precipitate the metal oxide. The metal oxide is inhibited from being precipitated in the field-effect transistor in which it is not preferable to precipitate the metal oxide. As a result, a high operation speed is realized in the semiconductor device of the present invention.

Figure 5:
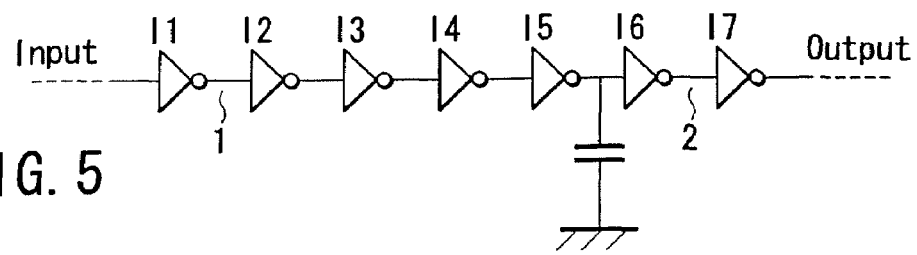
FIG. 5 is a circuit diagram of a model for use in analyzing an operation speed.

FIG. 5 shows a schematic view of the semiconductor device in which a circuit configured by continuous inverters is integrated. As shown in FIG. 5, the inverters are denoted with I1, I2, I3, I4, I5, I6, and I7 in order from an input portion. The inverter I7 is connected to an output portion.

The inverters I1, I2, I3, I4, I5, I6, and I7 form the internal circuit. It is assumed that a capacitance making the load of the previous-stage inverter is C, the current driving capability of the element forming the inverter is I, and the power supply voltage of the circuit is V. It is also assumed that the output of the inverter I5 is connected to a load capacitance having a size of 100×C. Then, in lowest-order approximation, a propagation delay time of the inverter I5 is 101 CV/I, and the propagation delay time of the other inverters is CV/I.

When CV/I=$\tau$, a time required for propagating a signal to a node 2 from a node 1 is 105 $\tau$. According to the method of the present embodiment, for the gate insulation film of the inverter I5 whose connected load capacitance is large, the average metal concentration is set to 0.3 or more, so that the precipitation of the metal oxide occurs. For the gate insulation films of the other inverters whose connection load capacitances are small, the precipitation is inhibited although the average metal concentration is same.

Conditions of the precipitation are assumed that the average value of metal concentration shown in FIG. 2=0.5, $nT^2$=0.8, R/T=0.46. This is a condition on which the curve C shown in FIG. 2 is maximized, and the average relative dielectric constant of the gate insulation film is 14.

The relative dielectric constant of the gate insulation film which contributes to the current driving capability of the field-effect transistor is obtained as 14.3 considering from parallel connection of parallel flat plate capacitors including insulation films having two types of relative dielectric constant in accordance with the amount of the precipitated metal oxide. The relative dielectric constant of metal silicate of a periphery in which the metal concentration drops with the precipitation of the metal oxide is calculated using the above equation (2).

However, as shown in FIG. 4, considering that the boundary of the region 6 having the high dielectric constant caused with the precipitation of the metal oxide is not a straight line, the relative dielectric constant of the gate insulation film contributing to the current driving capability is assumed to be lower than that of the region 6. Then, it is presumed that an effective ratio of the region 6 having the high relative dielectric constant caused with the precipitation of the metal oxide is ½ of a value obtained from a deposit amount. Under this presumption, the relative dielectric constant of the gate insulation film contributing to the current driving capability is obtained as 12.9.

When this value is used to control presence/absence of the precipitation of the metal oxide according to the method of the present embodiment, a time required for propagating the signal to the node 2 from the node 1 in the circuit of FIG. 5 is obtained to be 99 $\tau$.

In this manner, with the circuit shown in FIG. 5, the operation speed is enhanced by 6%. In this example, a case in which the load capacitance has only two types of sizes has been described. In the case, when the dielectric constant is varied with respect to the gate insulation film of each field-effect transistor to obtain optimum condition, the use of the insulation film having the high or low relative dielectric constant in the gate insulation film in the corresponding element may be determined.

The embodiments of the present invention will concretely be described hereinafter.

First Embodiment

Figure 6:
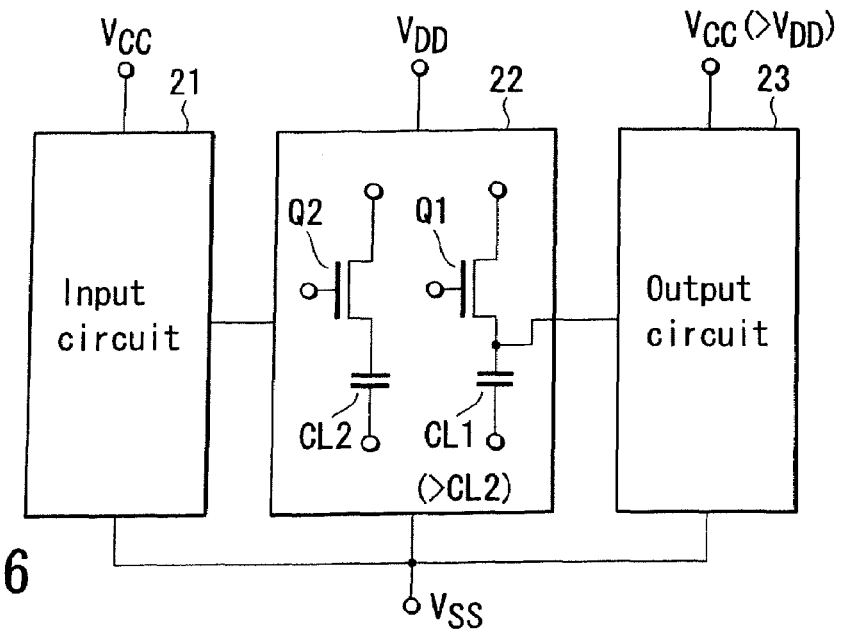
FIG. 6 is a block diagram of a semiconductor device according to a first embodiment of the present invention.

FIG. 6 is a block diagram showing a configuration of a semiconductor device according to a first embodiment of the present invention. As shown, the semiconductor device of the first embodiment includes an input circuit 21, an internal circuit (first circuit) 22, and an output circuit 23. Power supply voltages VCC of the input/output circuits (second circuits) 21 and 23 are set to be higher than a power supply voltage VDD of the internal circuit 22.

Here, the internal circuit (first circuit) 22 actually performs calculation, and is driven at a low voltage. The input/output circuits (second circuits) 21 and 23 function as an interface between the internal circuit and the outside, and are driven at a voltage higher than that of the internal circuit.

The internal circuit 22 includes two types of field-effect transistors Q1 and Q2. The load connected to the drain of the first field-effect transistor Q1 is representatively denoted with CL1 in the drawing. Similarly the load of the second field-effect transistor Q2 is denoted with CL2. In this case, CL1>CL2.

It is to be noted that the first field-effect transistor substantially drives the output circuit 23 in many cases, and therefore the capacitance of the output circuit 23 is included in CL1.

Furthermore, in the present embodiment, the average relative dielectric constant of the gate insulation film of the first field-effect transistor Q1 is set to be higher than that of the gate insulation film of the second field-effect transistor.

Figure 7:
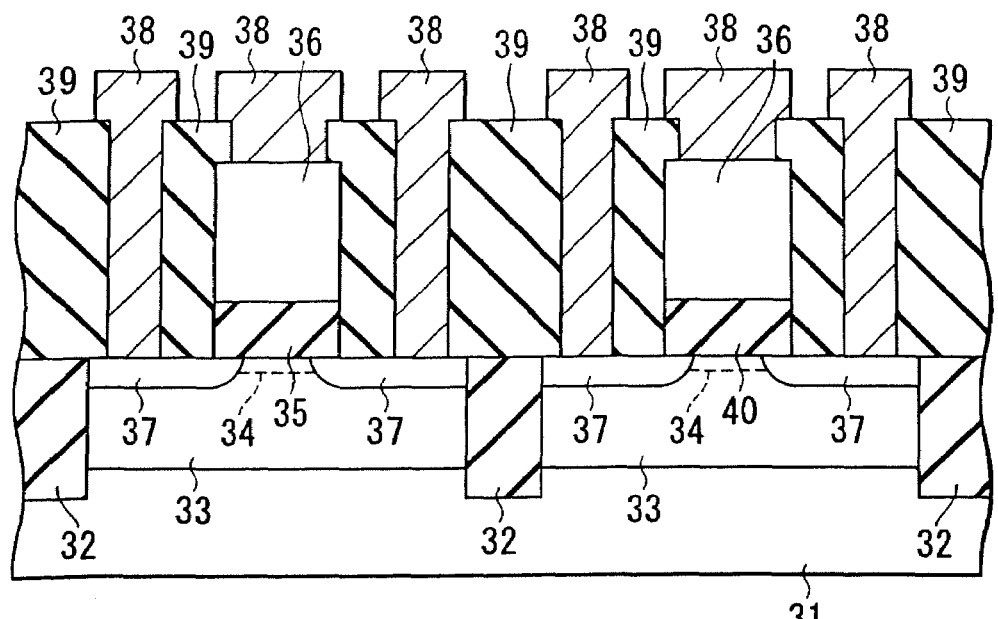
FIG. 7 is a sectional view of the semiconductor device of the first embodiment.

FIG. 7 is a sectional view showing one example of the internal circuit 22, the right transistor being Q1 and the left transistor being Q2. In the internal circuit 22, the first field-effect transistor Q1 does not have to be necessarily disposed adjacent to the second field-effect transistor. However, in FIG. 7, for the sake of convenience, the transistors are disposed adjacent to each other.

Here, an N channel field-effect transistor will be described as an example of the element of the integrated circuit. This also applies with a P channel field-effect transistor, when the conductivity type of impurities is reversed. This can further apply with a complementary field-effect transistor, for example, when methods such as a photolithography method are used to inject impurities only in a specific region in a substrate.

In this semiconductor device, element isolation regions 32 are formed on a P type silicon substrate 31 by a trench isolation method. In the P type silicon substrate 31, P well regions 33 are formed. In the P well regions 33, N channel regions 34 are formed. A gate insulation film 35, and a gate insulation film 40 having an average relative dielectric constant higher than that of the gate insulation film 35 are formed on the N channel regions 34, and gate electrodes 36 are formed on the gate insulation films 35 and 40. Reference numeral 37 denotes source and drain regions, 38 denotes wirings, and 39 denotes interlayer insulation films.

This semiconductor device comprises field-effect transistors including the gate insulation films which have several types of average relative dielectric constant. When the load capacitance connected to the drain region of the field-effect transistor is large, the average relative dielectric constant of the gate insulation film is set to be high. When the load capacitance is small, the average relative dielectric constant of the gate insulation film is set to be low. In this manner, while the load of the element is reduced, the current driving capability can be raised. As a result, there is the semiconductor device which has a high operation speed.

Figure 8:
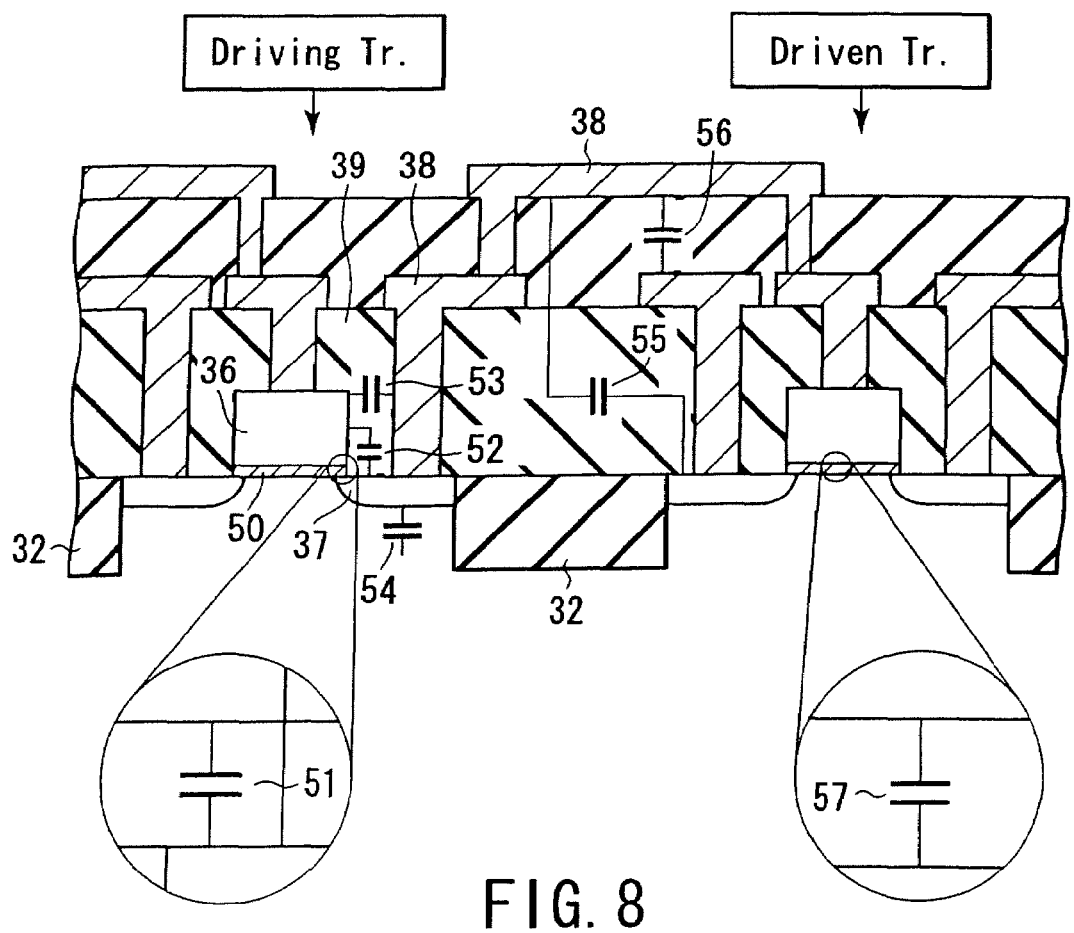
FIG. 8 is a schematic view showing a load capacitance of the semiconductor device.

Here, types of the capacitance which is the load for the driving field-effect transistor will be described. FIG. 8 is a schematic view of the field-effect transistor whose load capacitance is connected to the drain region. FIG. 8 shows the driving field-effect transistor on the left side, and the driven field-effect transistor on the right side.

In the driving field-effect transistor, an overlap capacitance 51 of the gate electrode 36 and drain region 37 is disposed as a parasitic capacitance of the transistor via a gate insulation film 50. A fringe capacitance 52 of the gate electrode 36 and drain region 37 exists as another parasitic capacitance via the interlayer insulation film 39. A gate/wiring capacitance 53 of the gate electrode 36 and wiring 38 via the interlayer insulation film 39, and a junction capacitance 54 of the drain region 37 exist as connected load capacitances.

Moreover, the driving field-effect transistor is connected to a capacitance 55 between the wiring and substrate and a capacitance 56 between the wirings as load capacitances. A channel capacitance 57 of the driven field-effect transistor is also connected as the load capacitance. Needless to say, when there are a plurality of driven field-effect transistors, the respective transistors make the load capacitances.

Figure 9A:
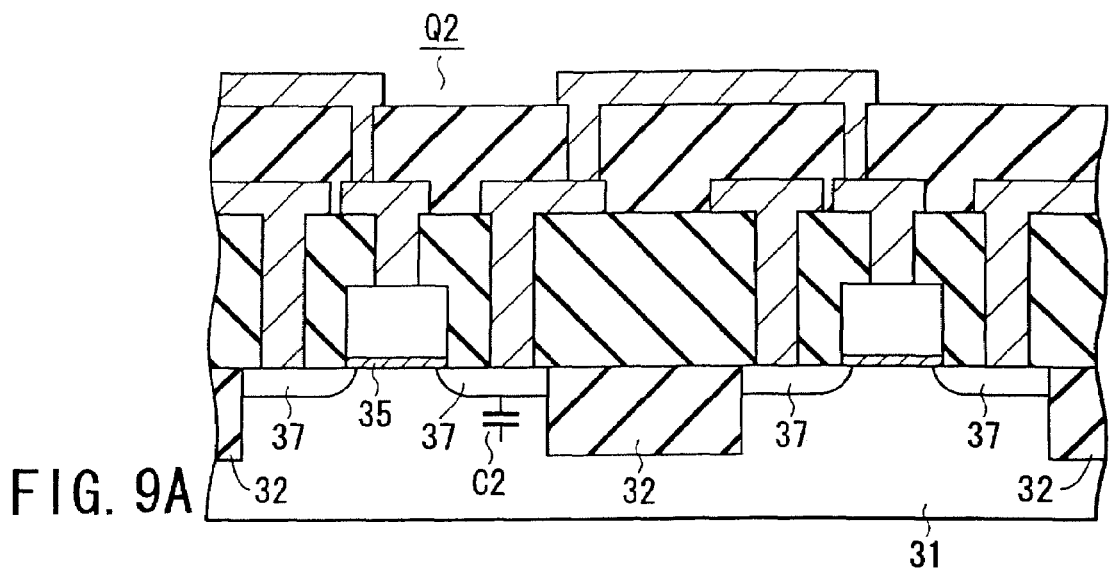
FIGS. 9A and 9B are sectional views of the semiconductor device according to the first embodiment.
Figure 9B:
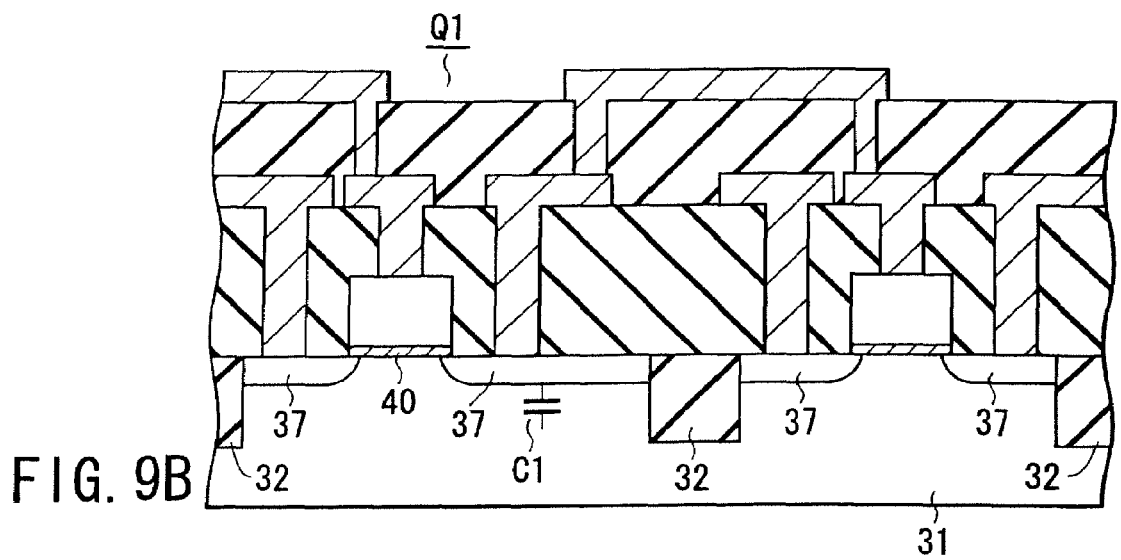

FIGS. 9A and 9B are sectional views of the semiconductor device according to the first embodiment, shows the driving field-effect transistor on the left side, and the driven field-effect transistor on the right side. Furthermore, concerning the driving transistor on the left side, FIG. 9A shows the second field-effect transistor Q2 connected to a junction capacitance C2, and FIG. 9B shows the first field-effect transistor Q1 connected to a junction capacitance C1. Since the size of the drain region 37 differs, the junction capacitance C1 connected to the first field-effect transistor Q1 is larger than the junction capacitance C2 connected to the second field-effect transistor.

Therefore, the gate insulation film 40 of the first field-effect transistor Q1 has a relative dielectric constant larger than that of the gate insulation film 35 of the second field-effect transistor Q2. These first and second field-effect transistors Q1 and Q2 are integrated on the same semiconductor substrate.

Figure 10A:
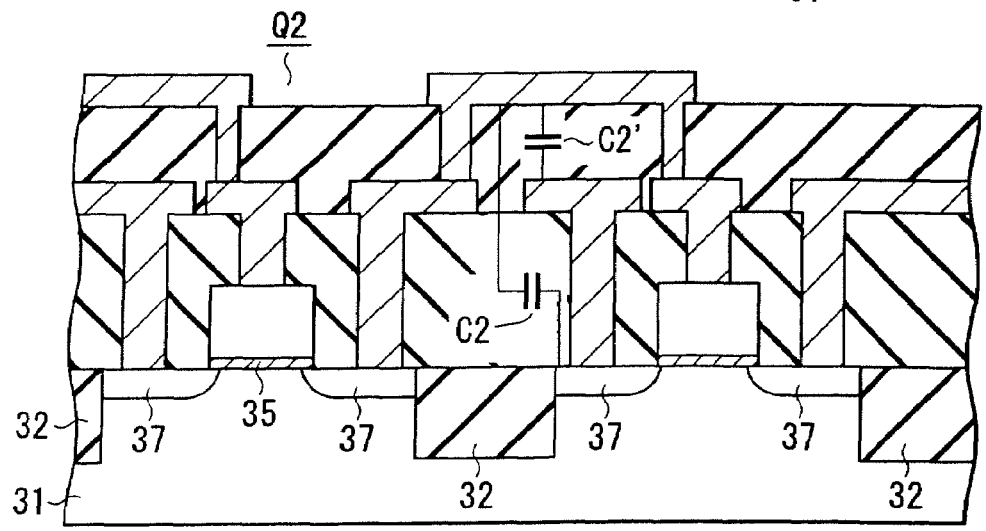
FIGS. 10A and 10B are other sectional views of the semiconductor device according to the first embodiment.
Figure 10B:
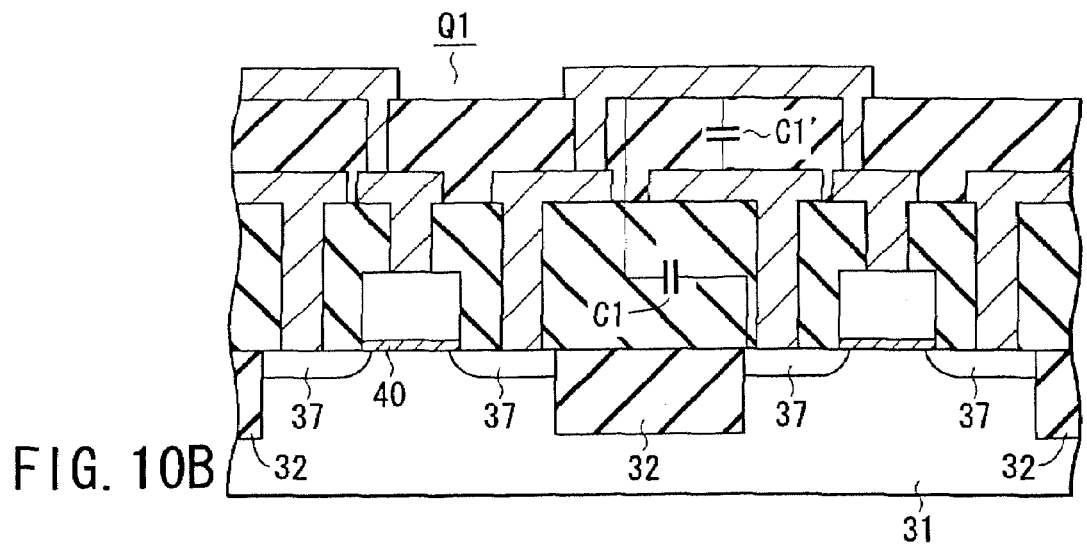

FIGS. 10A and 10B are sectional views of the semiconductor device according to the first embodiment, the driving field-effect transistor is shown on the left side, and the driven field-effect transistor is shown on the right side. Furthermore, concerning the driving transistor on the left side, FIG. 10A shows the second field-effect transistor Q2 connected to the capacitance C2 between the wiring and substrate, and a capacitance C2' between the wirings. FIG. 10B shows the first field-effect transistor Q1 connected to the capacitance C1 between the wiring and substrate, and a capacitance C1' between the wirings. Since the length of the wiring differs, the capacitances C1 and C1' connected to the first field-effect transistor Q1 are larger than the capacitances C2 and C2' connected to the second field-effect transistor Q2.

Therefore, the relative dielectric constant of the gate insulation film 40 of the first field-effect transistor Q1 is set to be larger than that of the gate insulation film 35 of the second field-effect transistor Q2. These first and second field-effect transistors are integrated on the same semiconductor substrate.

Figure 11A:
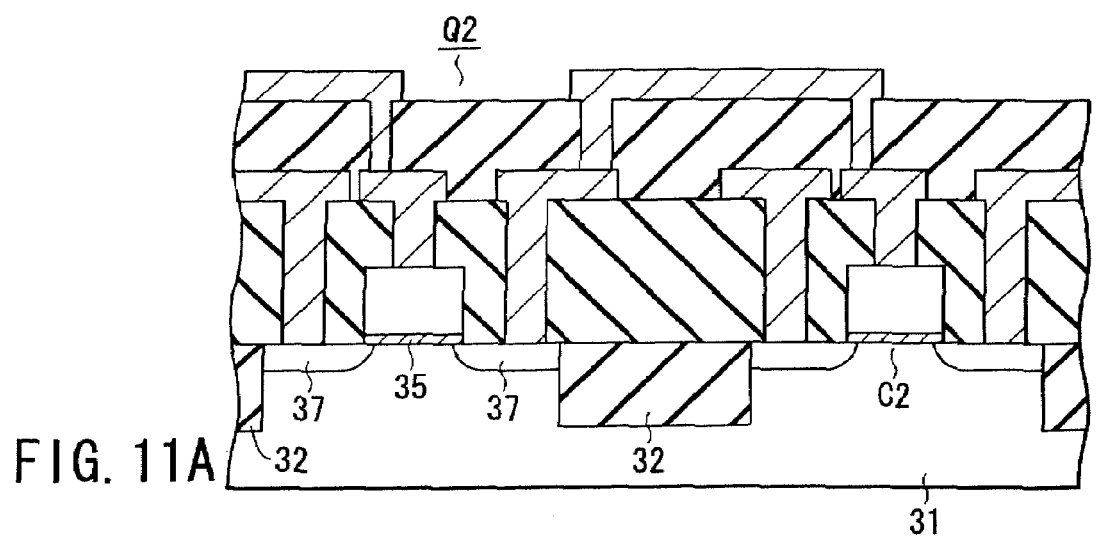
FIGS. 11A and 11B are further sectional views of the semiconductor device according to the first embodiment.
Figure 11B:
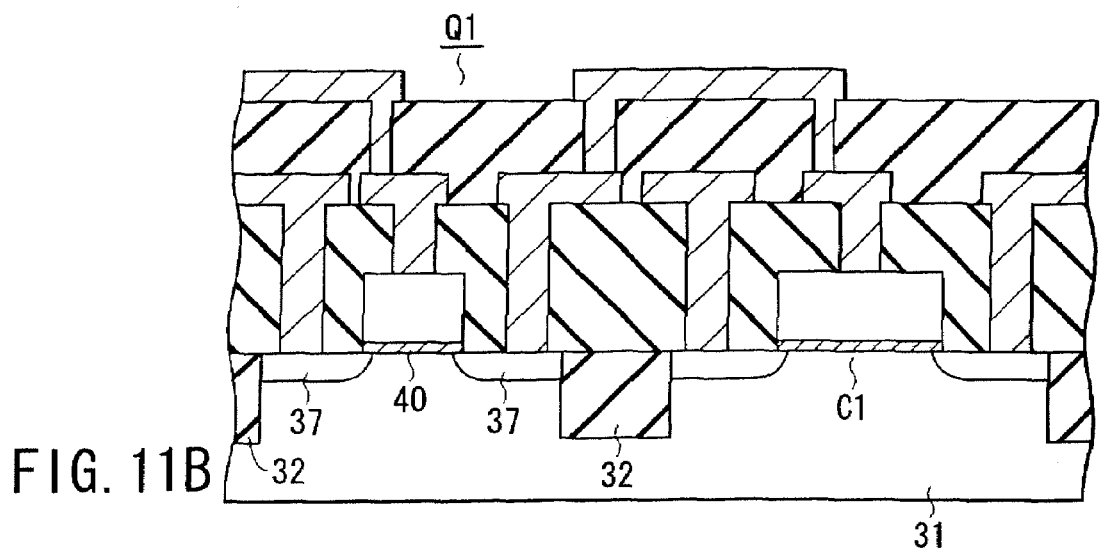

FIGS. 11A and 11B are further sectional views of the semiconductor device according to the first embodiment, the driving field-effect transistor is shown on the left side, and the driven field-effect transistor is shown on the right side. Furthermore, concerning the driving transistor on the left side, FIG. 11A shows the second field-effect transistor Q2 in which the channel capacitance C2 of the field-effect transistor is connected to the drain region. FIG. 11B shows the first field-effect transistor Q1 in which the channel capacitance C1 of the field-effect transistor is connected to the drain region. Since a gate length of the field-effect transistor differs, the channel capacitance C1 of the field-effect transistor connected to the first field-effect transistor Q1 is larger than the channel capacitance C2 of the field-effect transistor connected to the second field-effect transistor Q2.

Therefore, the relative dielectric constant of the gate insulation film 40 of the first field-effect transistor Q1 is set to be larger than that of the gate insulation film 35 of the second field-effect transistor Q2. These first and second field-effect transistors Q1 and Q2 are integrated on the same semiconductor substrate.

Second Embodiment

Next, a manufacturing method of the first and second field-effect transistors Q1, Q2 described in the first embodiment will be described in a second embodiment. For the sake of the convenience of the description, in the described example, Q1 is disposed adjacent to Q2 via the element isolation region.

Figure 12:
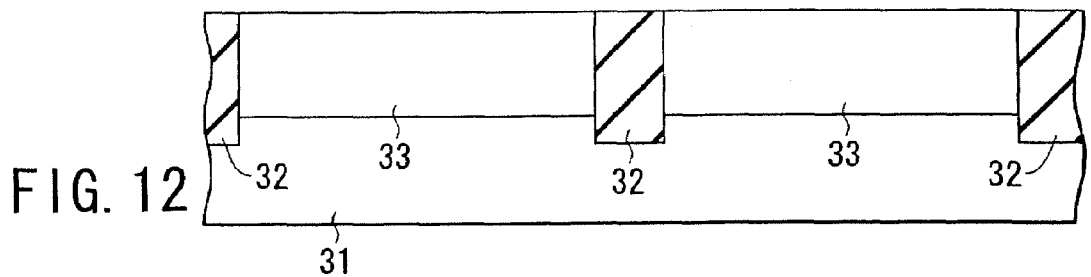
FIGS. 12 to 19 are sectional views showing a manufacturing process of the semiconductor device according to a second embodiment in stepwise manner.

First, as shown in FIG. 12, for example, on the P type silicon substrate 31, the element isolation regions 32 are formed by the trench isolation method. Subsequently, for example, boron (B) ions are implanted into a P well forming region at 100 keV, $2.0 \times 10^{13}$ cm$^{-2}$. Thereafter, the P well regions 33 are formed by a heat process, for example, at 1050° C. for 30 seconds.

Figure 13:
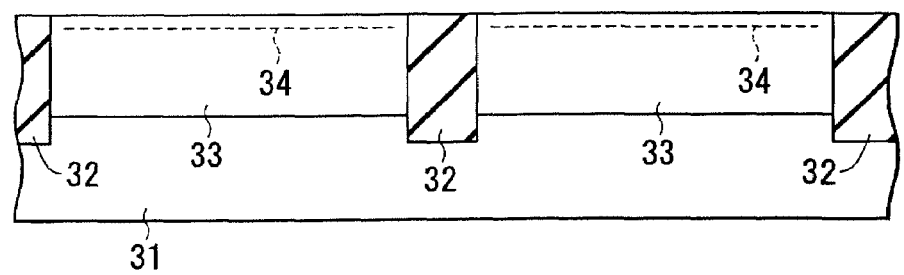

Next, as shown in FIG. 13, in the P well regions 33, to obtain a desired threshold voltage, for example, the B ions are implanted at 30 keV, $1.0 \times 10^{13}$ cm$^{-2}$, and the concentration of the surfaces of the N channels 34 is adjusted.

Figure 14:
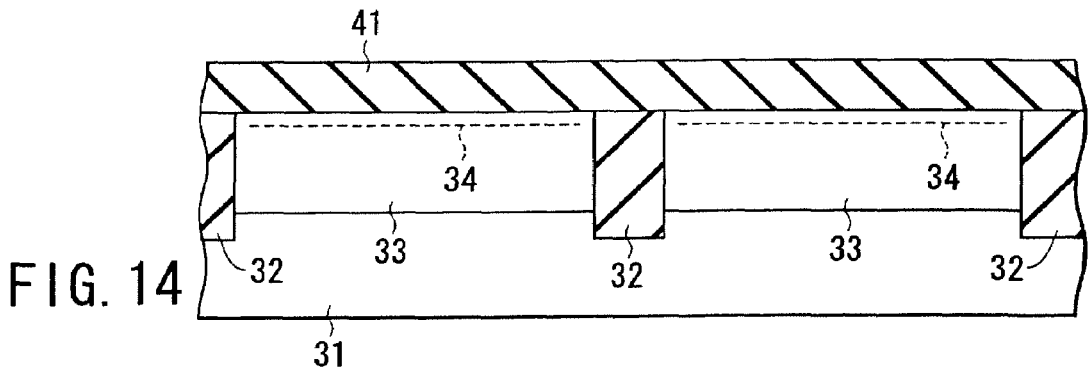

Next, as shown in FIG. 14, for example, by methods such as a sputter process, an $(HfO_2)_{0.5}(SiO_2)_{0.5}$ film 41 is formed on the silicon substrate 31.

Figure 15:
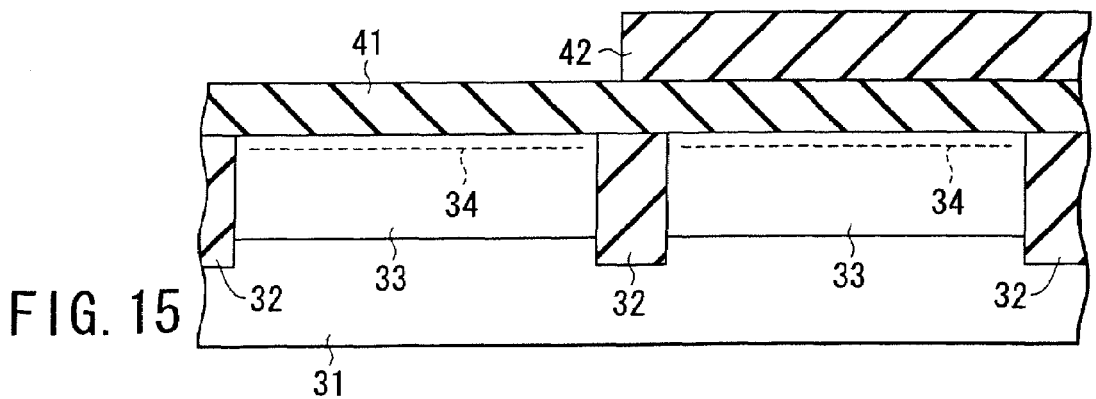

Next, as shown in FIG. 15, on the $(HfO_2)_{0.5}(SiO_2)_{0.5}$ film 41, for example, by a CVD process, a silicon nitride film (nitrogen diffusion preventive film) 42 having a thickness of 50 nm is deposited, and a part of the film is selectively removed. To selectively remove only one part, for example, by the methods such as a photolithography method, only a part of the semiconductor substrate is coated with a resist, and a part in which the silicon nitride film 42 is exposed may be removed in this state. It is possible to remove the silicon nitride film 42 by anisotropic etching such as a reactive ion etching (RIE) process, or by isotropic etching such as a chemical dry etching (CDE) process or a wet process.

Next, the silicon substrate 31 is exposed to gases whose temperatures are raised, such as $NH_3$, $N_2O$, $NO$, and $NO_2$, and nitrogen is introduced into a part of the $(HfO_2)_{0.5}(SiO_2)_{0.5}$ film 41. In this process, in a region of the $(HfO_2)_{0.5}(SiO_2)_{0.5}$ film 41 coated with the silicon nitride film 42, nitrogen is hardly introduced. It is to be noted that to introduce nitrogen, temperature does not have to be necessarily raised, and the silicon substrate 31 may also be exposed to a nitrogen gas, for example, in an excited state. Moreover, nitrogen may be accelerated and implanted.

Figure 16:
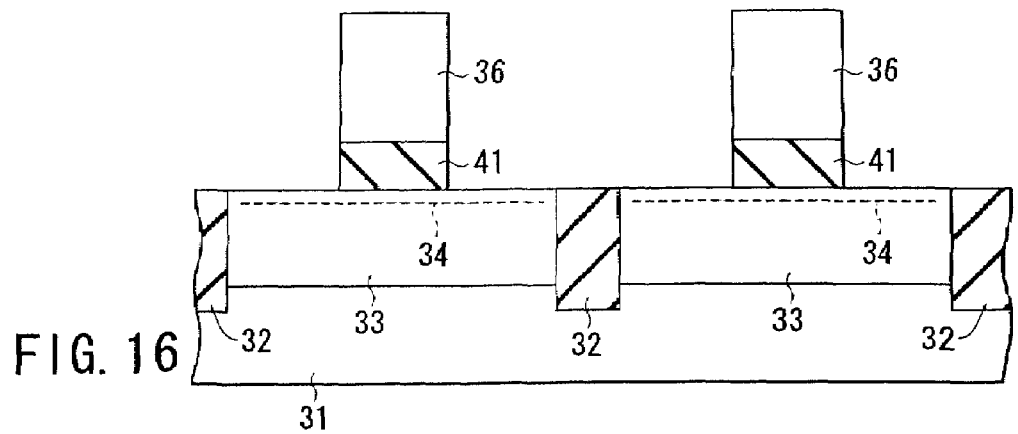

Next, as shown in FIG. 16, after removing the silicon nitride film 42, the method comprises: depositing a polycrystalline silicon film having a thickness of 100 nm on the $(HfO_2)_{0.5}(SiO_2)_{0.5}$ film 41, for example, by the CVD process; and processing the polycrystalline silicon film by the anisotropic etching such as the RIE process to form the gate electrodes 36. Subsequently, the anisotropic etching such as the RIE process is used to process the $(HfO_2)_{0.5}(SiO_2)_{0.5}$ film 41 in the gate insulation film. It is to be noted that the polycrystalline silicon film and $(HfO_2)_{0.5}(SiO_2)_{0.5}$ film 41 may also be processed by the isotropic etching such as the wet etching process.

Figure 17:
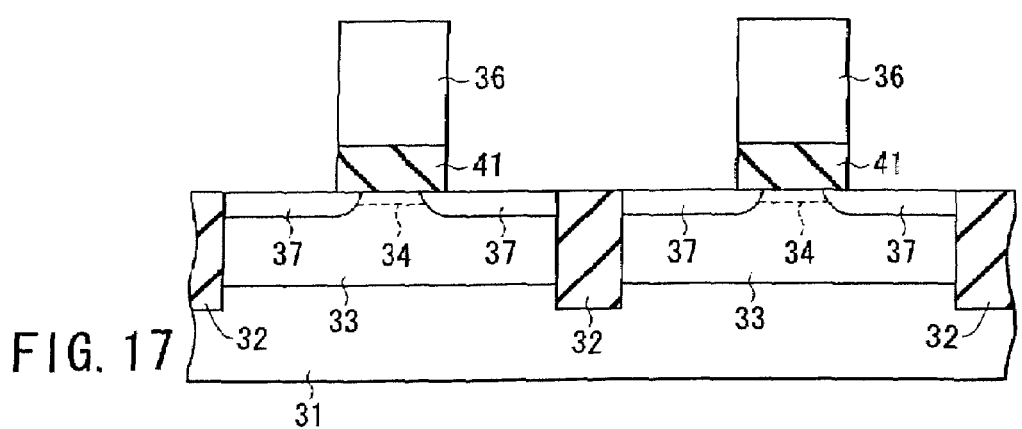

Next, as shown in FIG. 17, for example, arsenic (As) ions are implanted at 30 keV, $5.0 \times 10^{15}$ cm$^{-2}$. Moreover, by the heat process, the source region and drain region 37 are formed.

Figure 18:
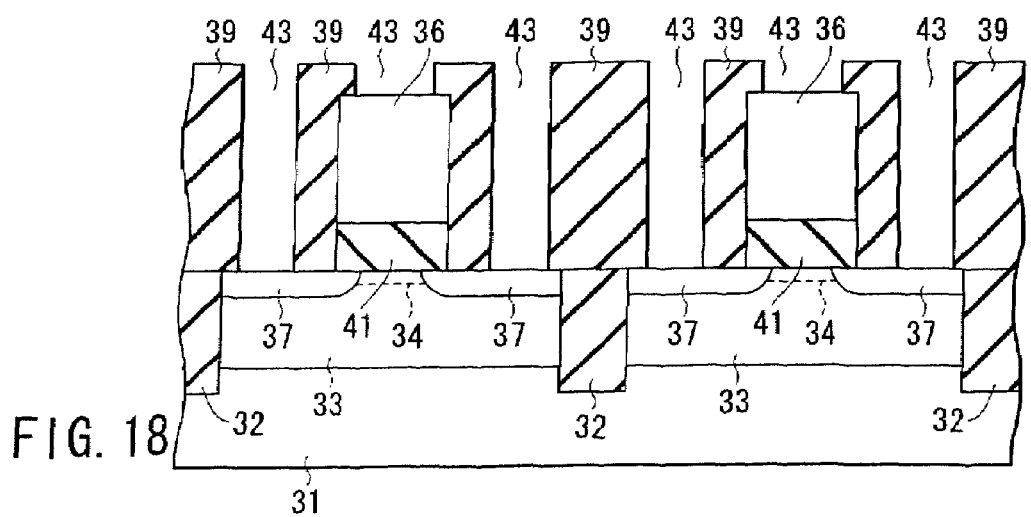

Next, as shown in FIG. 18, the method comprises: depositing the silicon oxide film 39 as the interlayer insulation film in a thickness of 500 nm, for example, by a chemical vapor deposition (CVD) process; and forming wiring holes 43 in the source and drain regions 37 and gate electrodes 36 by the RIE process.

Figure 19:
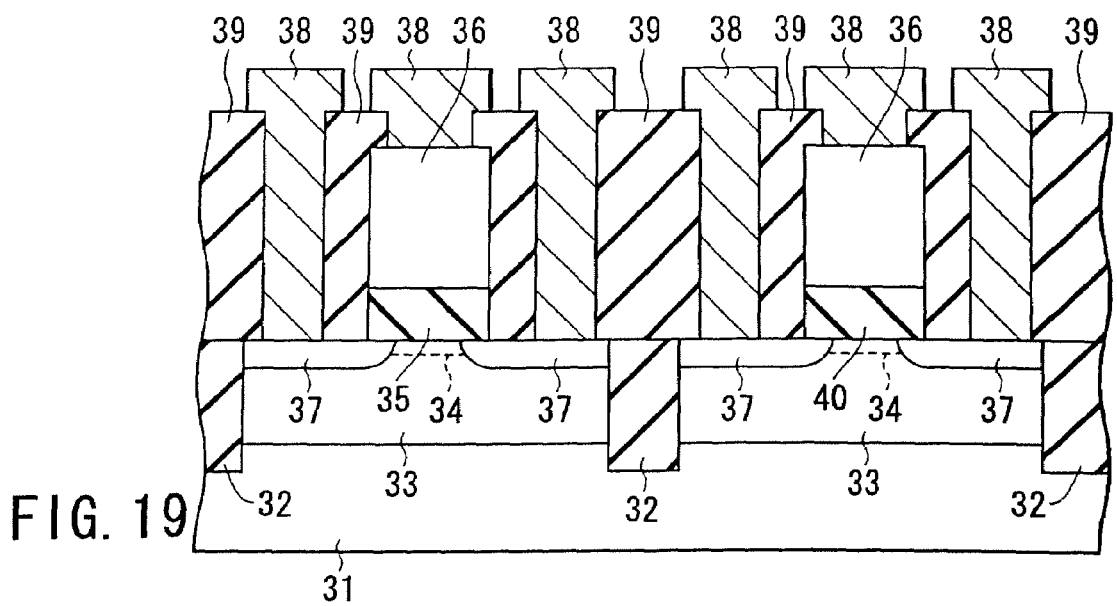

Next, as shown in FIG. 19, for example, by the sputter process, an aluminum film containing 1% of silicon and having a thickness of 300 nm is formed on the whole surface of the silicon substrate 31. Moreover, the aluminum film is subjected to the anisotropic etching such as the RIE process to form the wirings 38.

Thereafter, the semiconductor device is completed through a passivation process, and the like.

In order to prevent the precipitation of the metal oxide appearing through the heat process subjected to the metal silicate insulation film, it is effective to add nitrogen to the metal silicate film. Therefore, in the region of the $(HfO_2)_{0.5}(SiO_2)_{0.5}$ film 41 which has been coated with the silicon nitride film 42 in the step shown in FIG. 15, the precipitation of the metal oxide film occurs in the heat process (FIG. 17) at the forming time of the source/drain regions 37. In the region which has not been coated with the silicon nitride film 42, the metal oxide is inhibited from being precipitated. As a result, the semiconductor device of the present embodiment is formed including the field-effect transistor including the gate insulation film 35 having a certain average relative dielectric constant, and the field-effect transistor including the gate insulation film 40 having a higher average relative dielectric constant.

Here, as the integrated element in the semiconductor device, the N type field-effect transistor has been described in the embodiment. However, the embodiment can also be applied to the P type field-effect transistor, when the conductivity type of the impurities is reversed. Moreover, when the methods such as the photolithography method are used to introduce the impurities only into the specific region in the substrate, the embodiment can also similarly be applied to the complementary field-effect transistor.

Moreover, in addition to the field-effect transistor, the embodiment can also similarly be applied to the semiconductor device including active elements such as a bipolar transistor and single electron transistor, diode, or passive elements such as a resistor, inductor, and capacitor.

Furthermore, this also applies to a case in which an opto electronics integrated circuit (OEIC), a micro electro mechanical system (MEMS), and the like are formed. This further applies to the device including the element which includes a silicon on insulator (SOI) structure. Furthermore, this also applies to the device in which the elements are formed on a substrate subjected to epitaxial growth.

Additionally, here, As is used as the impurities for forming an N type semiconductor layer, and B is used as the impurities for forming a P type semiconductor layer, but other V-group impurities may also be used as the impurities for forming the N type semiconductor layer, or other III-group impurities may also be used as the impurities for forming the P type semiconductor layer. Moreover, the III or V-group impurities may also be introduced in the form of compounds containing the impurities.

Moreover, the impurities are introduced using ion implantation, but methods other than the ion implantation, such as solid-phase diffusion and gas-phase diffusion may also be used. Moreover, methods of depositing or developing impurities-containing semiconductors may also be used.

Furthermore, here, the element including a single drain structure has been described as an example, but the elements including structures other than the single drain structure, such as an extension structure, a lightly-doped drain (LDD) structure, and a graded diffused drain (GDD) structure may also be constructed.

Additionally, an element including a halo or pocket structure or an elevated source/drain structure may also be constructed. The present invention can also similarly be applied to an element in which a channel does not extend in parallel with a semiconductor substrate surface, and FIN-FET in which the channel is formed in parallel with the substrate surface in a plate-shaped semiconductor region disposed vertically to the substrate surface.

Moreover, here, the impurities are introduced into the source region and drain region after processing the gate insulation film, but the order of the introducing and processing of the impurities is not essential, and the steps may also be performed in a reverse order.

Furthermore, here, after processing the electrode, the gate insulation film is removed from the source region and drain region, but the gate insulation films on the source region and drain region do not have to be necessarily removed.

Additionally, silicidation is not described herein, but the source region, drain region, or gate electrode may be silicified. Moreover, the methods of depositing or developing the metal layers on the source region, drain region, and gate electrode may also be used.

Moreover, the sputter process is used to form the metal layer for the wiring, and methods different from the sputter process, such as a deposition method may also be used to form the metal layer. Furthermore, the other methods such as a method of selectively developing the metal and a damascene method may also be used.

Furthermore, here, polycrystalline silicon is used in the gate electrode, but semiconductors such as monocrystal silicon, amorphous silicon, and germanium-containing silicon, metals, metal-containing compounds, and stacked layers of these may also be formed.

Additionally, an upper part of the gate electrode has a structure in which the electrode is exposed, but insulating materials such as silicon oxide and silicon nitride may also be disposed in the upper part.

Moreover, here, to form the gate electrode, after depositing a gate electrode material, the anisotropic etching is performed to form the electrode, but the isotropic etching may also be used/performed in this step. Alternatively, embedding methods such as a damascene process may also be used to form the gate electrode.

Furthermore, here, the $(HfO_2)_{0.5}(SiO_2)_{0.5}$ film formed by the sputter process is used in the gate insulation film. However, the compounds of Hf, Si, O by other combinations of valences may also be used. Alternatively, other insulation films including other highly dielectric films of silicates of metals such as Ti, Ce, Zr, Ta, Al, La, Y, Gd, Dy, Pr, various elements-containing silicates, or oxide materials, or the stacked layers of these may also be used as the gate insulation film. These elements may also be embedded. When the metal silicate material is used to realize the insulation films having different values of the relative dielectric constant by the precipitation of the metal oxide, the average value of the metal concentration is preferably about 25% or more.

Additionally, here, even the gate insulation film having the low average relative dielectric constant has a thickness equal to that of the gate insulation film having the high average relative dielectric constant, but there is no necessity in the equal thickness, and the thickness may also be different. The semiconductor device may include elements including the gate insulation films which have different thicknesses.

Moreover, the method of forming the gate insulation film is not limited to the sputter method, and the other methods such as a deposition method, CVD method, and epitaxial growth method may also be used. When the oxide of a certain material is used in the gate insulation film, a method of first forming the film of the material and then oxidizing the film may also be used.

Furthermore, the semiconductor device including the element in which a ferroelectric film is used in the gate insulation film may also be formed.

Additionally, here, the silicon nitride film is used as the material with which a part of the gate insulation film is coated in order to selectively introduce nitrogen only in a part of the gate insulation film material, but the other materials may also be used. At least a part of the film may also be left and used as a part of the gate insulation film.

Moreover, here, nitrogen is introduced into the insulation film so as to reduce the metal oxide precipitation, but this may also be performed by another method.

Furthermore, here, distribution of nitrogen to be introduced into the gate insulation film in the insulation film has not been described. However, the essence of the introduction of nitrogen is to inhibit the precipitation of the metal oxide. Therefore, nitrogen is not necessarily important in the vicinity of opposite interfaces between the gate insulation film and the semiconductor substrate and between the gate insulation film and gate electrode. Therefore, even when the concentration of nitrogen is set to be low in the vicinity of either interface, a similar effect is obtained.

Especially when nitrogen exists in the vicinity of the interface between the gate insulation film and semiconductor substrate, mobility of the carrier drops, and therefore the current driving capability of the field-effect transistor drops. Therefore, when the nitrogen concentration in the vicinity of the interface between the gate insulation film and the semiconductor substrate is set to be low as compared with that in the interface between the gate insulation film and gate electrode, an advantage can be obtained that the drop of the current driving capability with the drop of the mobility is avoided.

Moreover, here, a gate sidewall insulation film has not been described. However, even when the gate sidewall insulation film is disposed, the similar effect is obtained.

Furthermore, here, the elements are isolated using the trench isolation method, but the other methods such as a local oxidation method and mesa type element isolation method may also be used to isolate the elements.

Additionally, here, post oxidation after the formation of the gate electrode has not been described. However, when a post oxidation step is possible considering from the gate electrode or the gate insulation film material, the step may also be performed.

Moreover, here, the silicon oxide film is used as the interlayer insulation film, but the materials such as silicon oxide, such as a low-dielectric-constant material may also be used in the interlayer insulation film.

Furthermore, it is also possible to form a self-aligned contact with respect to a contact hole.

Additionally, here, the semiconductor device including the wiring of a single layer has been described, but two or more layers of the element or the wiring may also be disposed.

Third Embodiment

Next, the steps of forming the semiconductor device according to a third embodiment will be described with reference to FIGS. 20 to 24.

Figure 20:
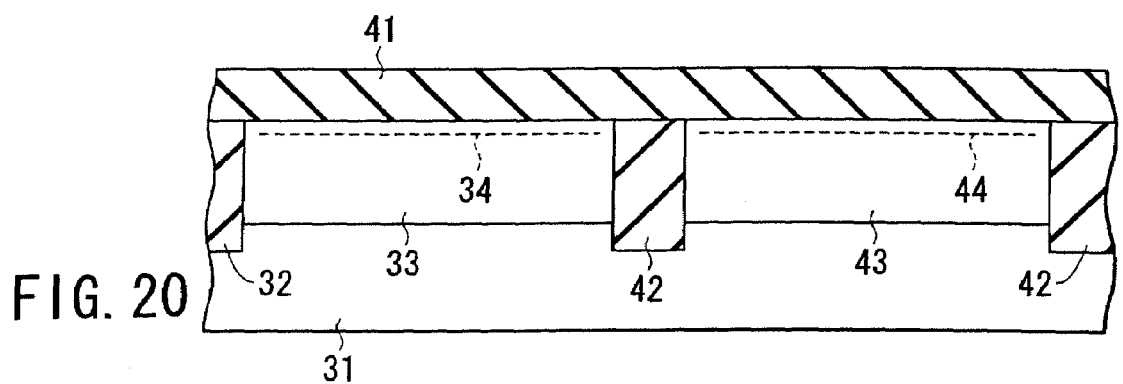
FIGS. 20 to 24 are sectional views showing the manufacturing process of the semiconductor device according to a third embodiment in stepwise manner.

In the forming steps, after the step shown in FIG. 14 of the second embodiment, as shown in FIG. 20, the silicon substrate 31 is exposed to the gases whose temperatures are raised, such as $NH_3$, $N_2O$, $NO$, and $NO_2$ to introduce nitrogen into the $(HfO_2)_{0.5}(SiO_2)_{0.5}$ film 41. To introduce nitrogen, without necessarily raising temperature, the silicon substrate 31 may also be exposed to the nitrogen gas, for example, in the excited state. Nitrogen may also be accelerated and implanted.

Figure 21:
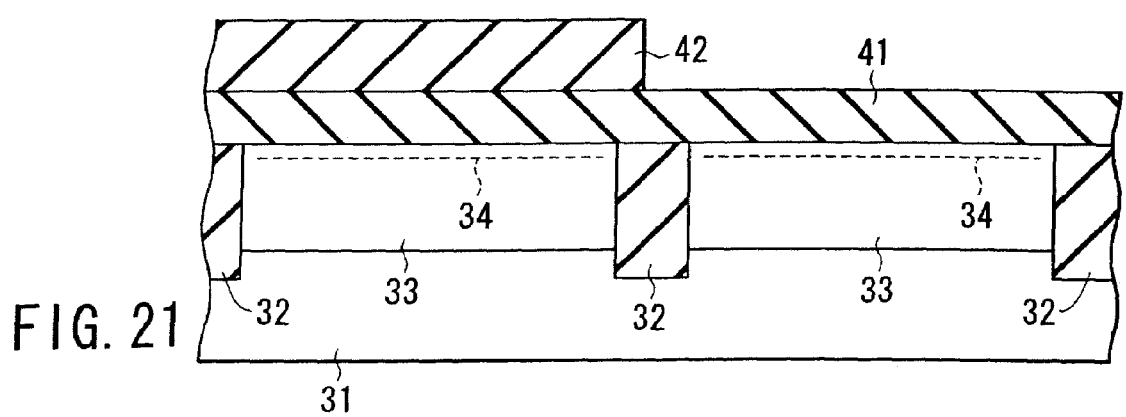

Next, as shown in FIG. 21, the method comprises: depositing the silicon nitride film 42 having a thickness of 50 nm on the $(HfO_2)_{0.5}(SiO_2)_{0.5}$ film 41, for example, by the CVD process; and selectively removing a part of the film. To selectively remove only one part, the methods such as the photolithography method may be used to coat only one part of the silicon substrate 31. In this state, the portion in which silicon nitride is exposed may be removed. Silicon nitride may be removed by the anisotropic etching such as the RIE process or by the isotropic etching such as the CDE process and wet process.

Figure 22:
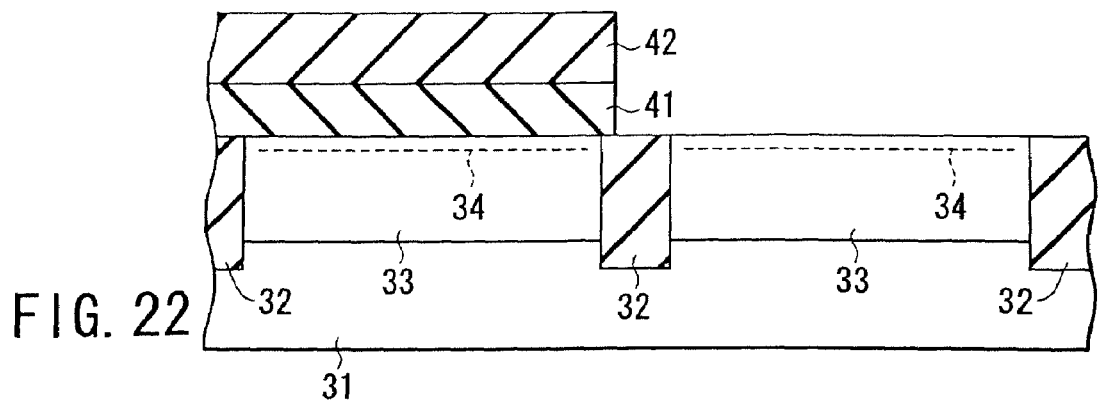

Next, as shown in FIG. 22, one portion of the $(HfO_2)_{0.5}(SiO_2)_{0.5}$ film 41 is subjected to the anisotropic etching such as the RIE process and removed. To remove the $(HfO_2)_{0.5}(SiO_2)_{0.5}$ film 41, the isotropic etching such as the CDE process and wet process may also be performed.

Figure 23:
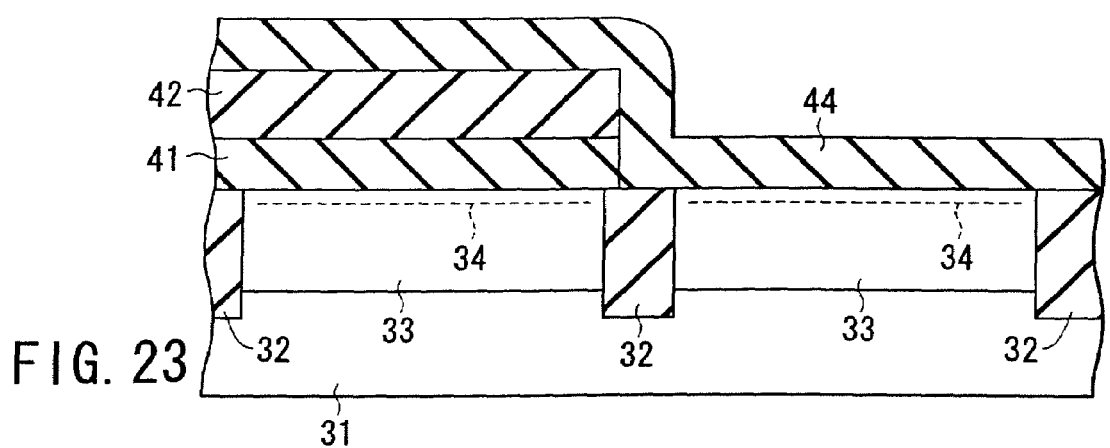

Next, as shown in FIG. 23, the methods such as the sputter process are used to form an $(HfO_2)_{0.5}(SiO_2)_{0.5}$ film 44 having a thickness of 5 nm.

Figure 24:
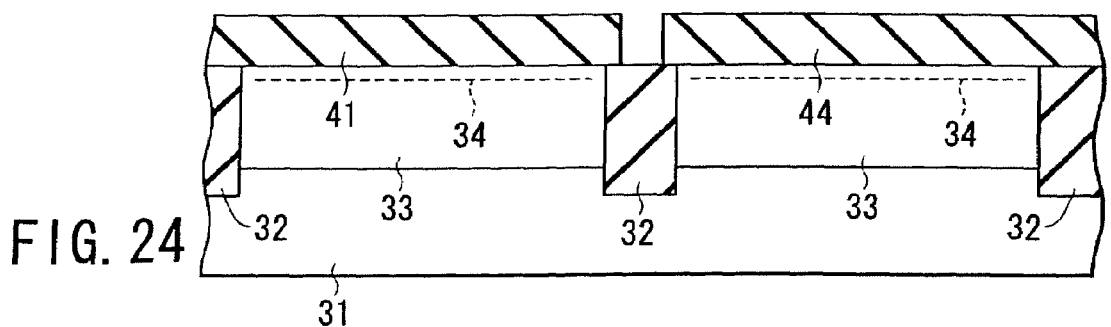

Next, as shown in FIG. 24, the $(HfO_2)_{0.5}(SiO_2)_{0.5}$ film 44 is subjected to the anisotropic etching such as the RIE process to selectively remove only a part of the film. To selectively remove only one part, only one part of the silicon substrate 31 is coated with resist by the methods such as the photolithography method. In this state, the part in which the $(HfO_2)_{0.5}(SiO_2)_{0.5}$ film 44 is exposed may be removed. It is to be noted that to remove the $(HfO_2)_{0.5}(SiO_2)_{0.5}$ film 44, the isotropic etching may also be performed such as the CDE process and wet process.

Subsequently, the silicon nitride film 42 is removed. To remove the silicon nitride film 42, the anisotropic etching such as the RIE process may also be performed, or the isotropic etching may also be performed such as the CDE process and wet process. These steps are also possible by flatting the film using a chemical mechanical polishing (CMP) process.

The subsequent steps are similar to those shown in and after FIG. 16 of the second embodiment. Even in this method, the effect similar to that of the second embodiment is obtained.

Moreover, the gate insulation film on the element isolation region other than a region between two shown field-effect transistors is not removed, but may also be removed.

Furthermore, here, the silicon nitride film 42 is disposed between two $(HfO_2)_{0.5}(SiO_2)_{0.5}$ films in order to form an etching stopper in removing the $(HfO_2)_{0.5}(SiO_2)_{0.5}$ film 44. When the $(HfO_2)_{0.5}(SiO_2)_{0.5}$ film 44 is removed, the silicon nitride film does not have to be disposed, for example, in a method of designating time. The materials other than silicon nitride may also be used. The silicon nitride film 42 on the $(HfO_2)_{0.5}(SiO_2)_{0.5}$ film 41, or at least one part of the $(HfO_2)_{0.5}(SiO_2)_{0.5}$ film 44 may also be left and used as a part of the gate insulation film.

Additionally, here, two Hf silicate films having the same composition have been formed. These two do not have to include the same composition, and may also be different films.

Fourth Embodiment

Next, the forming steps of the semiconductor device according to a fourth embodiment will be described with reference to FIGS. 25 to 27.

Figure 25:
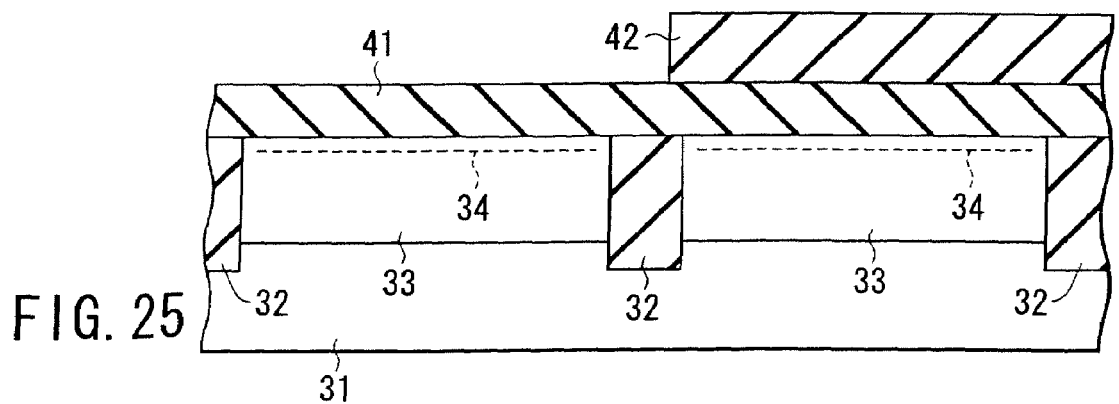
FIGS. 25 to 27 are sectional views showing the manufacturing process of the semiconductor device according to a fourth embodiment in stepwise manner.

The forming steps of the fourth embodiment comprise: the step shown in FIG. 14 of the second embodiment; thereafter depositing the silicon nitride film 42 having a thickness of 50 nm on the $(HfO_2)_{0.5}(SiO_2)_{0.5}$ film 41, for example, by the CVD process as shown in FIG. 25; and selectively removing one part of the film. A method of selectively removing only one part may comprise: using, for example, the photolithography process to coat only one part of the silicon substrate 31 with the resist; and removing the portion in which silicon nitride is exposed in this state. Silicon nitride may be removed by the anisotropic etching such as the RIE process or by the isotropic etching such as the CDE process or wet process.

Figure 26:
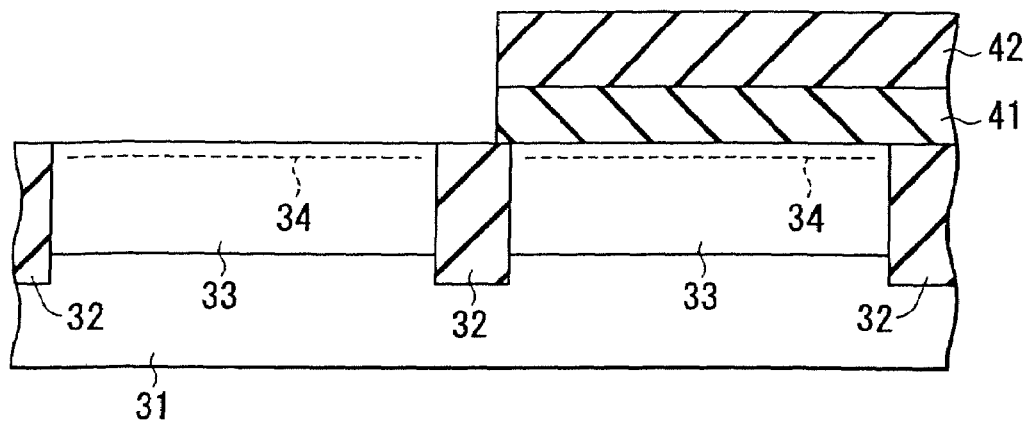

Next, as shown in FIG. 26, one part of the $(HfO_2)_{0.5}(SiO_2)_{0.5}$ film 41 is subjected to the anisotropic etching such as the RIE process and removed. It is possible to remove the $(HfO_2)_{0.5}(SiO_2)_{0.5}$ film 41 by the isotropic etching such as the CDE process or wet process.

Figure 27:
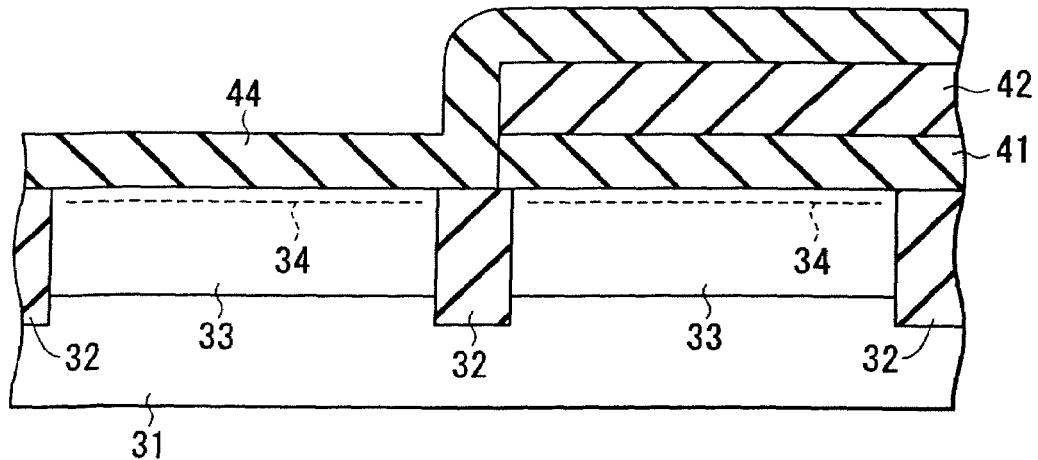

Next, as shown in FIG. 27, the $(HfO_2)_{0.5}(SiO_2)_{0.5}$ film 44 having a thickness of 5 nm is formed, for example, by the sputter process.

Subsequently, the silicon substrate 31 is exposed to the gases whose temperatures are raised, such as $NH_3$, $N_2O$, $NO$, and $NO_2$, to introduce nitrogen into the $(HfO_2)_{0.5}(SiO_2)_{0.5}$ film 44. To introduce nitrogen, without necessarily raising temperature, the silicon substrate 31 may also be exposed to the nitrogen gas, for example, in the excited state. Nitrogen may also be accelerated and implanted.

Thereafter, the steps are similar to those shown in and after FIG. 24 of the third embodiment.

Moreover, the silicon nitride film 42 is disposed between two $(HfO_2)_{0.5}(SiO_2)_{0.5}$ films 41 and 44 in order to function as a barrier of diffusion, when nitrogen is introduced in $(HfO_2)_{0.5}(SiO_2)_{0.5}$ film 44, or to function as the etching stopper, when the $(HfO_2)_{0.5}(SiO_2)_{0.5}$ film 44 is removed.

When the $(HfO_2)_{0.5}(SiO_2)_{0.5}$ film 44 is removed, for example, by the method of designating the time or a method of adjusting conditions for introducing nitrogen, it is also possible not to dispose the silicon nitride film 42. The materials other than silicon nitride may also be used.

Next, a modification example of the present embodiment will be described with reference to FIG. 28.

Figure 28:
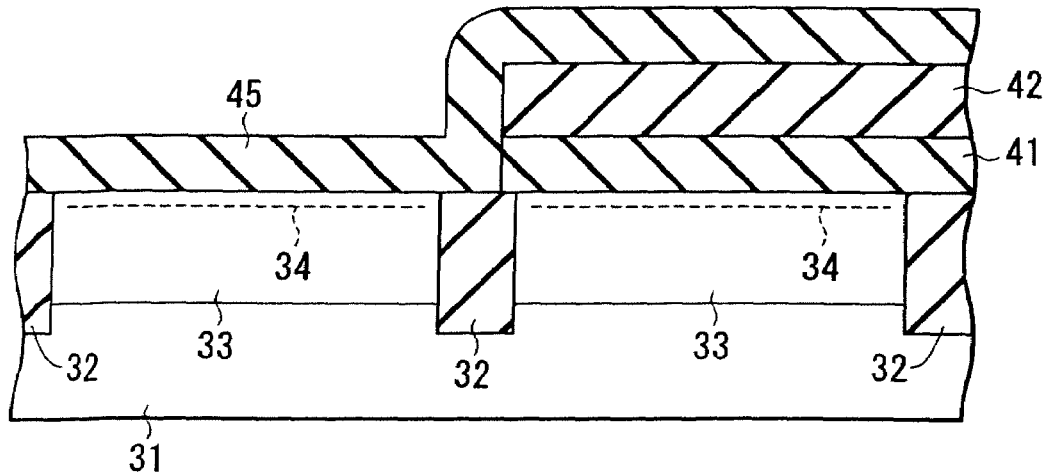
FIG. 28 is a sectional view of the semiconductor device according to a modification example of the fourth embodiment.

In the forming steps, after the step shown in FIG. 26, as shown in FIG. 28, the methods such as the sputter method are used to form a $(HfO_2)_{0.5}(SiO_2)_{0.5}$ film 45 to which, for example, nitrogen is added in a thickness of 5 nm. The subsequent steps are similar to those shown in and after FIG. 24.

Here, the method comprises: first forming the $(HfO_2)_{0.5}(SiO_2)_{0.5}$ film 41; selectively removing one part of the film; and thereafter forming the $(HfO_2)_{0.5}(SiO_2)_{0.5}$ film 45 to which nitrogen is added. However, this order is not essential, and the films may also be formed in the reverse order.

The present invention can be used in a logic circuit, a memory, and a system LSI apparatus formed by embedding the circuit and memory.

According to the present invention, there is provided the semiconductor device in which the average relative dielectric constant of the gate insulation film of the field-effect transistor having a large load capacitance is raised and that of the gate insulation film of the field-effect transistor having a small load capacitance is lowered to minimize the load of the element. Moreover, the current driving capability can be raised, and as a result, the operation speed is high.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a first and a second field-effect transistors comprising:

forming first and second well forming regions separated by a plurality of isolation regions in a semiconductor substrate;

forming first and second well regions of a first conductivity type by implanting an impurity of a first conductivity type into the first and the second well forming regions;

forming a first gate insulation film on the first and the second well regions;

introducing nitrogen into the first gate insulation film by exposing the first gate insulation film to a nitrogen-containing atmosphere;

selectively removing the first gate insulation film on the first well region;

newly forming a second gate insulation film on the first well region;

forming a polycrystalline silicon film on the first and the second well regions via the first and the second gate insulation films;

forming first and second gate electrodes above the first and the second well regions by selectively and anisotropically etching the polycrystalline silicon film; and forming a first and a second pair of source/drain regions by implanting and thermally diffusing an impurity of a second conductivity type into the first and the second well regions, using the first and the second gate electrodes as masks, respectively.

2. The manufacturing method according to claim 1, wherein the first and the second gate insulation film include silicon, oxygen, and a metal element.

3. The manufacturing method according to claim 2, wherein the forming of a first and a second pair of source/drain regions includes precipitating an oxide of the metal element in the gate insulation film on the first well region.

* * * * *